United States Patent [19]

Fomin et al.

[11] Patent Number: 5,428,216
[45] Date of Patent: Jun. 27, 1995

[54] OPTO-ELECTRONIC SENSOR DEVICE USING A TRANSPARENT INJECTING ELECTRODE TO BLOCK OUTSIDE RADIATION

[75] Inventors: Aleksandr M. Fomin, Kazan; Leonid S. Lioubchenko; Boris I. Zapadinskii, both of Moscow, all of Russian Federation; Alexander A. Dadali, Bayonne, N.J

[73] Assignee: Ornetics International, Inc., Hackensack, N.J.

[21] Appl. No.: 128,796

[22] Filed: Sep. 29, 1993

[51] Int. Cl.⁶ .............................................. H01J 40/14
[52] U.S. Cl. .................................. 250/208.1; 257/291
[58] Field of Search ......................... 250/208.1, 214.1; 257/291, 59, 72

[56] References Cited

U.S. PATENT DOCUMENTS

| | | | |
|---|---|---|---|
| 3,624,428 | 11/1971 | Weimer et al. | 307/311 |
| 3,676,688 | 7/1972 | Sharples et al. | 250/211 R |
| 4,099,206 | 7/1978 | Desbois et al. | 358/213 |
| 4,354,104 | 10/1982 | Chikamura et al. | 250/211 J |
| 4,549,088 | 10/1985 | Ozawa | 250/578 |
| 4,562,474 | 12/1985 | Nishizawa | 358/213 |
| 4,839,511 | 6/1989 | Thompson et al. | 250/211 R |
| 4,878,120 | 10/1989 | Matsumoto et al. | 358/213.12 |
| 4,889,983 | 12/1989 | Numano et al. | 250/211 J |
| 4,916,304 | 4/1990 | Itabashi et al. | 250/211 R |
| 4,931,661 | 6/1990 | Fukaya et al. | 250/578.1 |

Primary Examiner—David C. Nelms
Assistant Examiner—Steven L. Nichols
Attorney, Agent, or Firm—Klauber & Jackson

[57] ABSTRACT

A high resolution sensor device for storing electromagnetic radiation and for transforming electromagnetic radiation into electrical/video signals. Such a sensor device is comprised of: 1) a transistor matrix having a Metal/Dielectric/Semiconductor (MDS) structure; 2) a conducting layer; 3) an active medium; 4) a transparent electrode; 5) horizontal and vertical scanning circuits; and 6) a voltage source. The structure of the sensor device is such that the conducting layer is formed on the surface of the dielectric layer, outside the regions of the gates, in the MDS-transistor matrix. The active medium is formed over the conducting layer, the dielectric layer, and the gates. The transparent electrode is formed on the surface of the active medium. The transistor drains are connected to vertical bus-bars of a vertical scanning circuit, while the transistor sources are connected to horizontal bus-bars of a horizontal scanning circuit. The transparent electrode and the conducting layer are connected to a voltage bias supply.

14 Claims, 7 Drawing Sheets

OPTO-ELECTRONIC SENSOR DEVICE USING A TRANSPARENT INJECTING ELECTRODE TO BLOCK OUTSIDE RADIATION

BACKGROUND OF THE INVENTION

1. Field of the Invention

The present invention relates to photo-electric devices and, more particularly, to a high resolution sensor device for storing electromagnetic radiation and for transforming electromagnetic radiation into electrical/video signals.

2. Description of the Prior Art

Various devices exist for storing and transmitting optical information, however many of these devices have serious drawbacks which limit their applications. For example, a vacuumless transmitting device (without a vacuum tube) for low-dynamic television (only a few pictures per second) is not only bulky, but it requires a special tape accumulator and another special device to provide jump-movement. Furthermore, such a device is dynamically inert. To increase the resolution of these existing devices, the width of an intersecting bus-bar must be reduced, which not only introduces considerable technical complications, but also results in a decrease in sensitivity and an increase in the levels of interference and resistance in a simple cell. In solid photo-detectors having a matrix design, where photo-diodes act as photo-receptors, Metal/Dielectric/Semiconductor (MDS) transistors act as switch-keys. These devices are basically solid, photo-electric (electro-magnetic) convertors. Existing telecameras for Optic Memorization Systems (OMS) are based on such devices, but such telecameras generally have low resolution capabilities ($\leq 10$ mm$^{-1}$) and their operating conditions cannot be regulated. A matrix of photo-receptors that is used for holographic OMS are, technically speaking, much more similar to the present invention. A single matrix cell consists of a photo-diode and two MDS transistors. The photo-diodes have a common cathode and their anodes are connected to the MDS transistor sources. To increase sensitivity, a large portion of the single matrix cell's area is occupied by the photo-diode.

Thus, the following contradiction arises: an increase in resolution (i.e. the density of cell locations) results in a decrease in sensitivity, whereas an increase in the number of cells, with the density remaining constant, causes a significant increase in the dimensions of the matrix.

SUMMARY OF THE INVENTION

The present invention contemplates a high resolution sensor device for storing electromagnetic radiation and for transforming electromagnetic radiation into electrical/video signals. This sensor device is comprised of: 1) a transistor matrix having a Metal/Dielectric/Semiconductor (MDS) structure; 2) a conducting layer; 3) an active medium; 4) a transparent electrode; 5) horizontal and vertical scanning circuits; and 6) a voltage source.

The structure of the sensor device is such that the conducting layer is formed on the surface of the dielectric layer, outside the regions of the gates, in the MDS-transistor matrix. The active medium is formed over the conducting layer, the dielectric layer, and the gates. The transparent electrode is formed on the surface of the active medium. The transistor drains are connected to vertical bus-bars of a vertical scanning circuit, while the transistor sources are connected to horizontal bus-bars of a horizontal scanning circuit. The transparent electrode and the conducting layer are connected to a voltage bias supply.

The dielectric layer insulates the active medium, the conducting layer, and the gates from direct contact with the channels, sources, and drains of each transistor in the MDS-transistor matrix. The active medium serves a hermetic function for the MDS-transistor matrix. The transparent electrode acts as a shield against outside interference.

The active medium either may be fabricated entirely of a photo-conducting material or may be fabricated of multiple layers of which one is fabricated of a photo-conducting material. The photo-conducting material is preferably a ferro-magnetic material and/or a ferro-electric material and/or a piezo-electric material and/or a luminescent material and/or an organic polymeric material having specific electrical and magnetic properties.

The purpose of the present invention sensor device is to expand the functional capabilities, increase the resolution, and miniaturize the design of existing photo-electric devices. Accordingly, the present invention sensor device may be used in: 1) systems for the detection of electromagnetic radiation in a broad range computer technologies; 2) information systems for the reception, transmission, and analysis of optical images; and 3) holographic permanent memorizing systems (PMS). The present invention sensor device may also be used in scanning photo-receptor TV equipment (one or two-dimensional), as it is virtually a solid telecamera. Furthermore, the present invention sensor device can electronically control the dynamic range and sensitivity, which also allows one to: 1) strobe an optic signal; 2) make an operative analysis of a picture's brightness; and 3) diagnose images.

The density of cells in the present invention sensor device is more than thirty times as great as in existing photo-electric devices. This increase in cell density increases the specific resolution ($\geq 100$ mm$^{-1}$) while, at the same time, decreases the sensor device to a miniature size (no larger than 1 cm$^2$). Thus, the present invention sensor device provides a much higher memory capacity in holographic PMS (up to $10^8$ bits and more) than existing photo-electric devices. In addition, the present invention sensor device has the advantage of serving multiple functions, unlike its predecessors. Not only can it transform pictures into video signals, but it can also save information, reverse record, and store information in memory for long periods of time with frequent readings. A dramatic improvement in design parameters (in particular, resolution) ensures that the present invention sensor device can function as both a transmitting telecamera and an opto-electronic matrix switch with multiple different positions. The simplicity and the feasibility of manufacturing the present invention sensor device should also be noted, which is the result of modern MDS micro chip technology.

MDS transistors in existing photo-electric devices are typically communicated through vertical and horizontal scanning circuits. To increase sensitivity, a sizeable portion of the area of the matrix cell is filled with photo-diodes. However, an increase in resolution (as determined by the density of cells) causes a decrease in sensitivity, whereas an increase in the number of cells (which occurs when their density level remains constant) demands a considerable increase in the size of the matrices. Furthermore, the manufacture of large, solid matrices is technically quite difficult and involves an increase in cost.

The aim of the present invention sensor device is to eliminate these drawbacks associated with existing photo-electric devices by increasing the number of possible applications with a higher resolution and a reduction (miniaturization) in size. This goal is achieved by equipping the sensor device with the active medium, having the photo-conducting material contained therein, and the conducting layer. The active medium is typically a multi-layer structure having a layer of photo-conducting material, or a photo-conducting layer, formed as one of the multiple layers. The transparent electrode is formed on the surface of the active medium, such that there is no direct electrical contact between the transparent electrode and the conducting layer. The transparent electrode and the conducting layer are both connected to the voltage source, which regulates their voltage as well as the relative voltage bias between the conducting layer and ground. The transparent electrode is capable of injecting charge-carriers into the photo-conducting layer. This makes it possible to sharply increase the density of charge-carriers in the transistors and the level of resolution. A video signal is recorded through the bus-bars connected to the sources and drains of each transistor. The sensitivity and dynamic range are regulated by controlling the number of charge-carriers in the active medium and the relative voltage bias between the conducting layer and ground.

From the above descriptive summary it is apparent how the present invention sensor device overcomes the shortcomings of existing photo-electric devices.

Accordingly, the primary objective of the present invention is to provide a high resolution sensor device for storing electromagnetic radiation and for transforming electromagnetic radiation into electrical/video signals.

Other objectives and advantages of the present invention will become apparent to those skilled in the art upon reading the following detailed description and claims, in conjunction with the accompanying drawings which are appended hereto.

BRIEF DESCRIPTION OF THE DRAWINGS

In order to facilitate a fuller understanding of the present invention movable hand sign, reference is now made to the appended drawings. The drawings should not be construed as limiting the present invention, but are intended to be exemplary only.

FIGS. 3-6 are the results of experimental research that was performed on a model of a photo-sensitive cell, using an organic photo-conducting layer.

PREFERRED EMBODIMENT OF THE PRESENT INVENTION

The Device Structure

Figure 1:
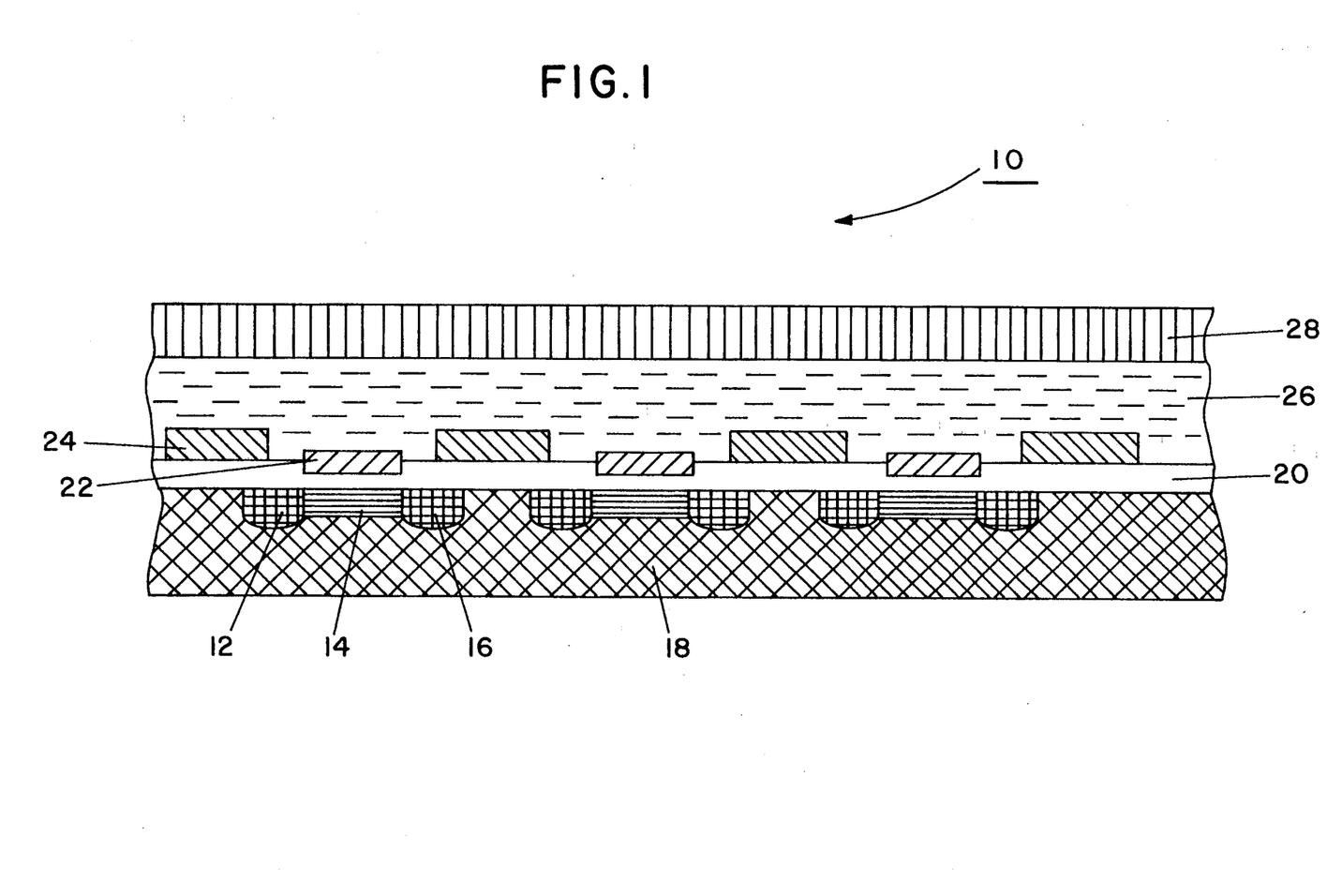
FIG. 1 is a cross-sectional view of a photo-sensitive cell that is typical of a photo-sensitive cell in a matrix of photo-sensitive cells in a sensor device according to the present invention.

Referring to FIG. 1, there is shown a cross-sectional view of a photo-sensitive cell (10) that is typical of a photo-sensitive cell in a matrix of photo-sensitive cells in a sensor device according to the present invention. Within this photo-sensitive cell (10), a matrix of field transistors, comprised of a source (12), a channel (14), and a drain (16), are formed within a substrate (18). These field transistors, along with the substrate (18), are in direct contact with a bottom surface of a dielectric layer (20). A conducting layer (24) is formed on a top surface of the dielectric layer (20). The conducting layer (24) is patterned such that openings are formed therein corresponding to the location, across the dielectric layer (20), of the channel (14) of each field transistor in the transistor matrix. Within each of these openings in the conducting layer (24), a gate (22) is formed along the top surface of the dielectric layer (20). Thus, a gate (22) is formed along the top surface of the dielectric layer (20) for each field transistor in the transistor matrix directly above a respective transistor channel (14). An active medium (26) is formed over the conducting layer (24), the transistor gates (22), and the dielectric layer (20). A transparent electrode (28) is formed over the active medium (26).

The dielectric layer (20) insulates the active medium (26), the conducting layer (24), and the gates (22) from direct contact with the channels (14), sources (12), and drains (16) of each field transistor. The active medium (26) provides a hermetic covering for the field transistors. The transparent electrode (28) acts as a shield against outside interference.

Figure 8:
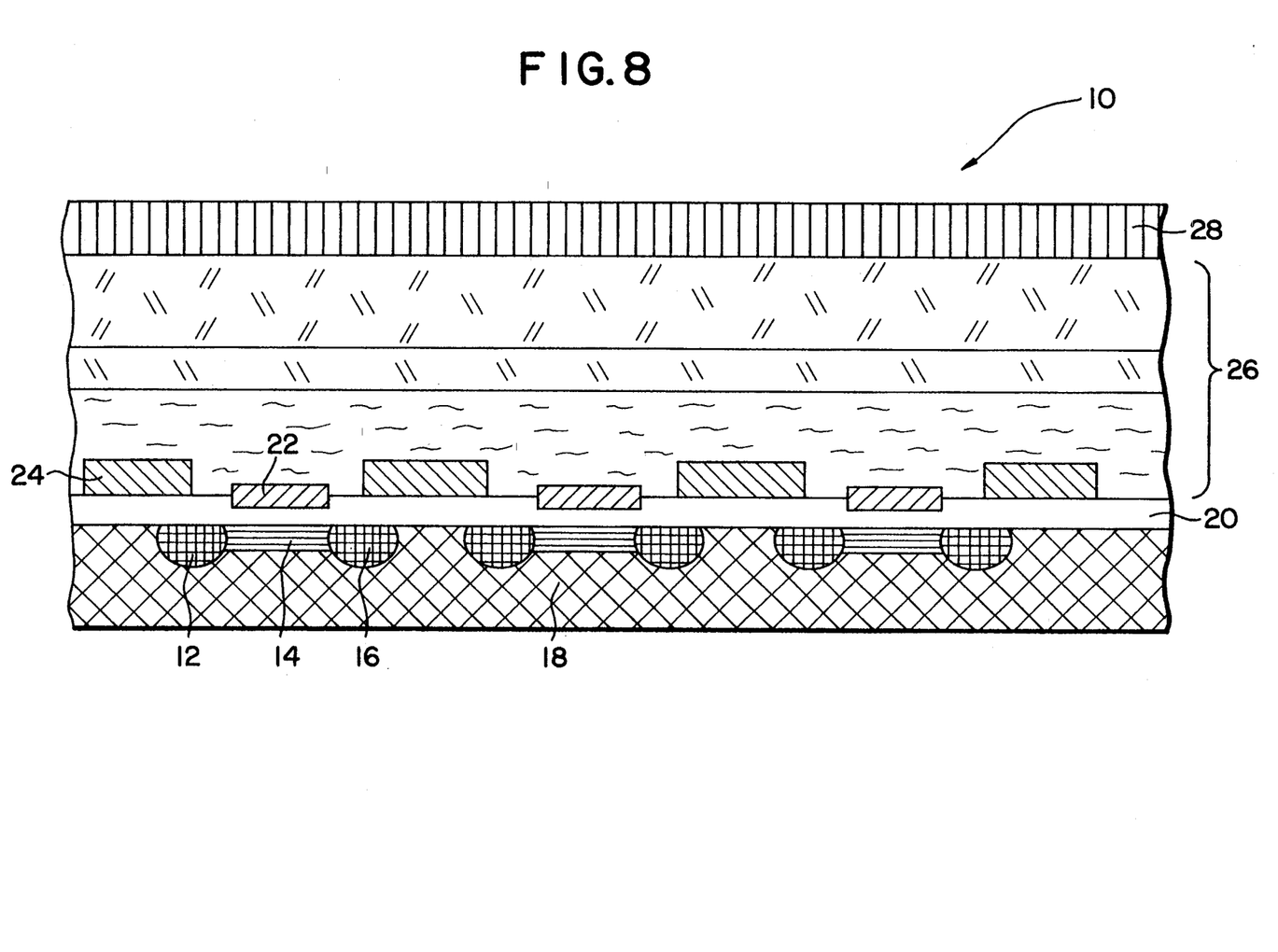
FIG. 8 is a cross-sectional view of a photo-sensitive cell, similar to that shown in FIG. 1, having an active medium of multiple layers.

The active medium (26) either may be fabricated entirely of a photo conducting material or may be fabricated of multiple layers of which one, a photo-conducting layer, is fabricated of a photo-conducting material (see FIG. 8). The photo-conducting material is preferably a ferro-magnetic material and/or a ferro-electric material (with $\epsilon >> 1$) and/or a piezo-electric material and/or a luminescent material and/or an organic polymeric material having specific electrical and magnetic properties. The thickness of the photo-conducting layer may be represented by $d_{phc}$, while the thickness of a ferro-magnetic material layer may be represented by $d_{fm}$, the thickness of a ferro-electric material layer may be represented by $d_{se}$, the thickness of a piezo-electric material layer may be represented by $d_{pe}$, the thickness of a luminescent material layer may be represented by $d_{lm}$, and the thickness of an organic polymeric material layer may be represented by $d_{op}$.

The transistor drains are connected to vertical bus-bars of a vertical scanning circuit, while the transistor sources are connected to horizontal bus-bars of a horizontal scanning circuit. The transparent electrode and the conducting layer are connected to a voltage bias supply. The active medium serves a hermetic function for the MDS-transistor matrix. The transparent electrode acts as a shield against outside interference.

Figure 2:
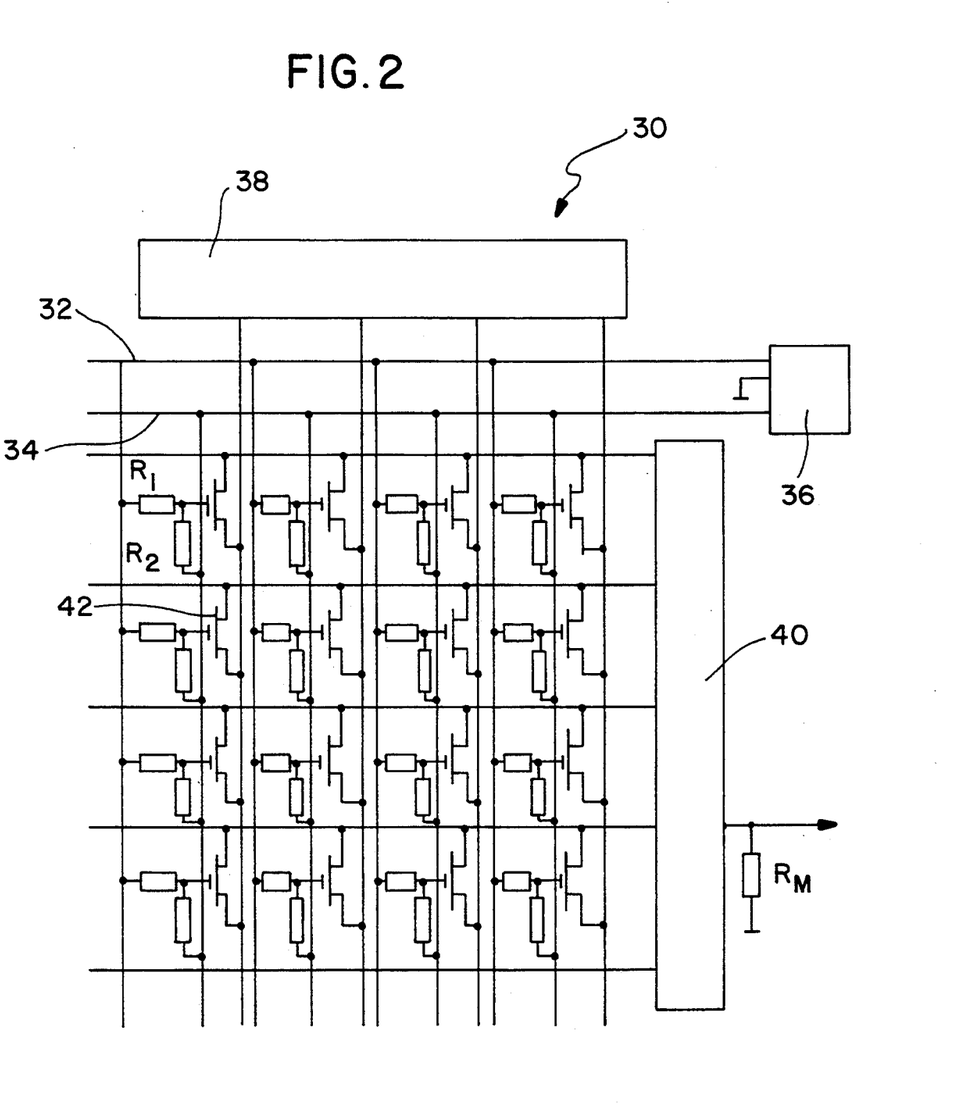
FIG. 2 is a schematic diagram of a sensor device according to the present invention.

Referring to FIG. 2, there is shown a schematic diagram of a sensor device (30) according to the present invention. Within this device (30), a transparent injecting electrode (32) and a conducting layer (34) are connected to a voltage source (36) so that it is possible to control the voltage applied to the photo-conducting layer and regulate the relative voltage bias between the conducting layer (24) and ground.

A sampling of a video-signal is produced through horizontal (38) and vertical (40) scanning circuits connected to the source and drain areas of each of a number of transistors (42) in the matrix. These scanning circuits (38 and 40) are set up in such a way that the sources of the transistor columns and the drains of the transistor rows are connected to horizontal and vertical bus-bars associated with the horizontal and vertical scanning circuits (38 and 40), respectively.

As a result of heavy light absorption into the photo-conducting layer, photo-generation occurs in the area near the transparent injecting electrode (32), thus altering the R1/R2 ratio and the gate potential under light conditions. The video signal at $R_H$ is also altered as a result of the continuous matrix scanning by the scanning circuits. The scanning circuits performing the sampling of video signals from the separate transistors may have various design constructions. Readings may be obtained from separate image fields. Sensitivity is regulated by changing the voltage to the photo-conducting layer or the voltage bias between the conducting layer (34) and ground, which means changing the operating point of the transistors. The transparent injecting electrode (32) is grounded for an alternating current (as with a condenser that is plugged into the voltage source). This ensures that the transistors will be shielded from electromagnetic interference, which could occur when impulse light sources are in play. As previously described, the photo-conducting layer provides additional hermetization of the transistor matrix.

At this point it should be noted that $R_1$ represents the equivalent resistance of the area of the photo-conducting layer between the transparent injecting electrode (32) and a gate of a matrix transistor (42), while $R_2$ represents the equivalent resistance of the area of the photo-conducting layer between the gate of that same matrix transistor (42) and the conducting layer (34) around it. $R_H$ represents the load resistance.

THE PHOTO-CONDUCTIVITY PHASE

Referring to FIGS. 1 and 2, in high electric fields ranging from $10^3$ to $10^4$ V/cm, with the injection of charge carriers from the transparent injecting electrode (28), the photo-conducting layer experiences a current drain that is limited by a space charge limited current (SCLC) so that the voltage-ampere characteristic (VAC) suddenly becomes non-linear in U, which represents voltage bias between the conducting layer and ground. At this point, the photo-response changes according to the change in voltage to the photo-conducting layer. The simple cell's photo-sensitivity is regulated by changing the level of injection from the transparent injecting electrode (28). The matrix MDS transistors have many different identifying features. On a surface area of 1 cm$^2$ it is possible to produce a photo-conducting layer that is quite uniform. As a result, it is possible to electronically control sensitivity and dynamic range quite effectively. It should be noted that with devices currently in use, the dynamic range is the only feature that can be controlled. Another advantage is that the curve of the photo-conductor layer's VAC and its close dependence on layer thickness make it possible to eliminate the cross-effect of a "parasite current" so characteristic of other matrix systems, where one matrix cell is "shunted" by the surrounding cells. In designs already in use this effect is reduced by grounding the inoperative matrix conductor by a special grounding register.

In the present invention sensor device, the build-up time of a cell's photo-response depends on the speed of photo-generation and the time required for the charge carriers to flow through the photo-conducting layer from the transparent injecting electrode. A decline in the cell's photo-response after lighting has stopped is caused by the destruction of charge-carrier traps before they are filled, as determined by their level of injection. Accordingly, the present invention sensor device functions at an optimal speed.

THE CHARGE ACCUMULATION PHASE

During this phase, the voltage across the photo-conducting layer is that by which the VAC of the photo-conducting layer obeys Ohm's law. There is high resistance from the area of the simple cell and the charge relaxation time, or the time needed to discharge the space charge in the photo-conducting layer, is greater than the time needed to complete a picture-frame. Further communication of the photo-conducting layer occurs by scanning the surface of the photo-conducting layer with a thin ray of light. In the present invention sensor device, a light ray scans the photo-conducting layer onto which the image has also been projected. The light creates a powerful conductive channel in the photo-conducting layer through which the area between the gate (22) and the conducting layer (24) is charged. After the light ray has been projected, resistance ($R_1$) from the photo-conducting layer (26) is then restored and the local capacity (referred to above) is discharged with a time constant according to the light created by the picture at this place. After the light scan, a potential relief is thus formed in the area close to the surface of the gate in the photo-conducting layer (26). Once the light ray has projected the entire image, there is a new charged area in the photo-conducting layer. At this point, the current of the additional charge depends upon the degree of discharge, as determined by the overall quantity of light from the picture acting on the given area during the time of the picture-frame. As a result, the gate potential of the MDS transistor changes corresponding to the given parts of the picture that are illuminated. Optic scans should be synchronized with readings by corresponding video-signal circuits from the MDS matrix transistors. The commutation time of the simple cell ranges from $10^{-7}$ to $10^{-6}$ sec., and the time needed to transmit a picture-frame ranges from $10^{-2}$ to 1 sec. In other words, the accumulation coefficient can be as high as $10^3$ to $10^7$. It is possible to perform an optic scan using other devices currently in use.

LONG-TERM INFORMATION STORAGE

This phase, having a combined action of lighting and electric field, is marked by a steady internal polarization resulting from the division of non-equilibrium charge carriers in the field, which are subsequently trapped in deep traps inside the photo-conductor's energy gap (photo-electron state). Once the field has been shut off and lighting has stopped, this state is maintained for quite a long period of time, as the time it takes to clean the electron traps at a depth of 0.8 eV is approximately 900 sec., whereas at 0.98 eV it is approximately $8.6 \times 10^5$ sec. (at 290° K). A potential relief is thus formed in the photo-conducting layer, capable of being stored safely for long periods and of giving frequent readings. When the polarized photo-conductor is illuminated, the traps are cleaned. Recorded information may be erased either by irradiation with light (which evacuates the traps), or by applying the injection voltage to the transparent electrode (28), which results in the quantum energy levels in the active medium being filled with injecting charge carriers. It should be noted that the choice of methods for erasing information offered by this device makes it possible to record the subsequent image in a positive or negative manner.

Experimental research was conducted on a model of simple photosensitive cell to determine its photo-sensitivity. The experiment involved the use of: a measuring sandwich cell containing a sample of a polymer photo-conductor, a field transistor with an insulated gate; a source of adjustable voltage, and a set of standard reference resistors. For stationary lighting, an incandescent halogen lamp with a set of neutral filters was used. The light pulses were extracted from an ISSh-15 flasher (flash energy $\approx 1.6$ J, flash time=7 μsec). A video-signal was registered by load resistance ($R_H$) with a S8-3 memorizing oscillograph. With a light power of $J = 3.5 \times 10^{-6}$ W (only $0.01 \times J_{max}$) falling on the surface of the photo-conducting layer, and taking into account absorption by the transparent electrode, the video signal reaches 0.2 V, corresponding to the cell's photosensitivity of $5.7 \times 10^4$ V/W (at $\lambda = 400$ nm), with a sensitivity threshold of $1.2 \times 10^{-8}$ W ($2.5 \times 10^{10}$ photon/cm² sec).

Figure 3:
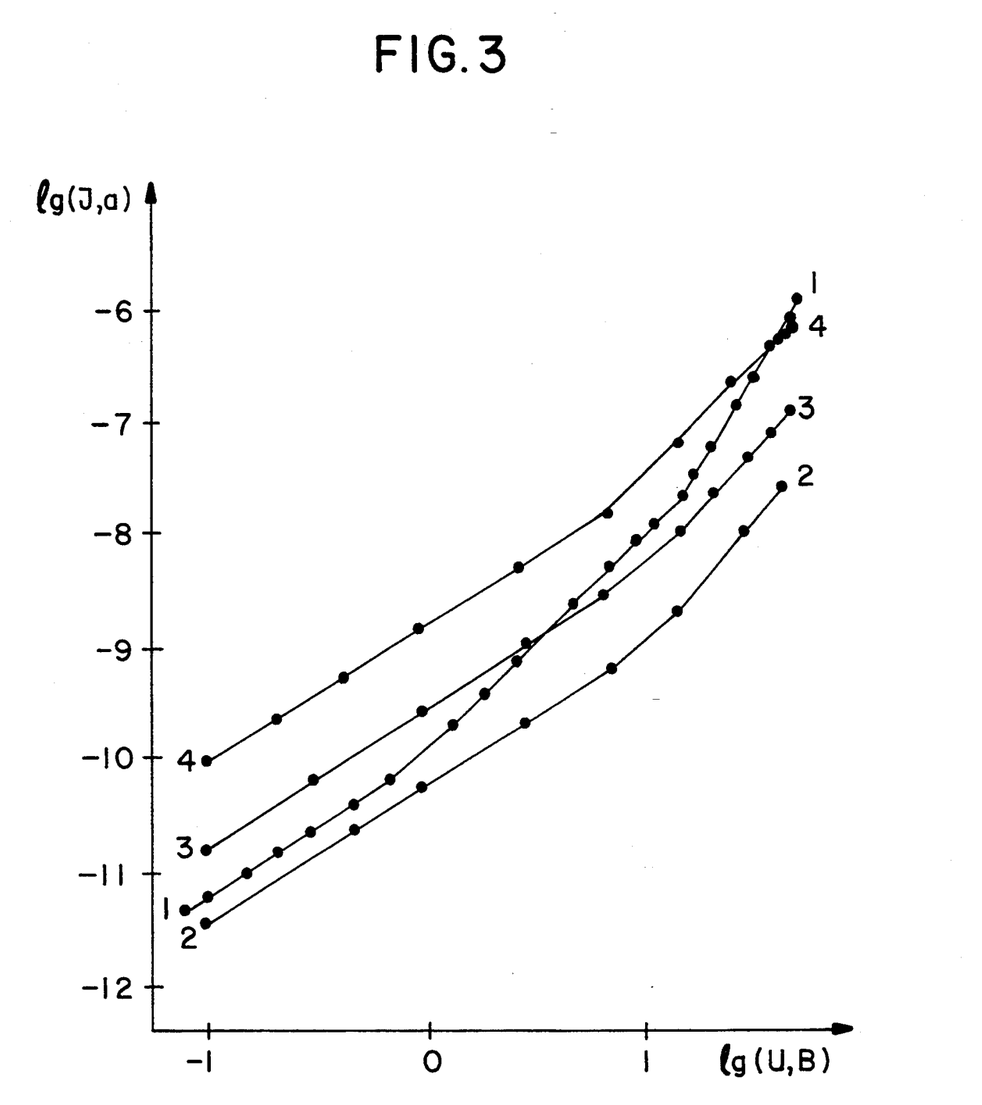
FIG. 3 is a graph showing the stationary volt-ampere characteristics (VAC) in a photo-conducting layer in a photo-sensitive cell similar to that shown in FIG. 1.

Referring to FIG. 3, a graph of the stationary volt-ampere characteristics (VAC) in a photo-conducting layer in the simple photosensitive cell is given for four different levels of light intensity (at $\lambda = 400$ nm). The four different levels of intensity are: 1) no light; 2) $I = 0.01 \times I_{max}$ photon/cm² sec.; 3) $I = 0.1 \times I_{max}$ photon/cm² sec.; and 4) $I = 7 \times 10^{14} \times I_{max}$ photon/cm² sec. The type of VAC photo-current (curves 2,3,4) is not determined by the light's intensity. A non-linear increase in the photo-current may be observed in fields greater than $3 \times 10^3$ V/cm, where there is a sharp increase in current for dark VAC (the phase of SCLC). This results in a non-linear displacement in the quantum-ampere characteristics with increased voltage across the active medium.

Figure 4:
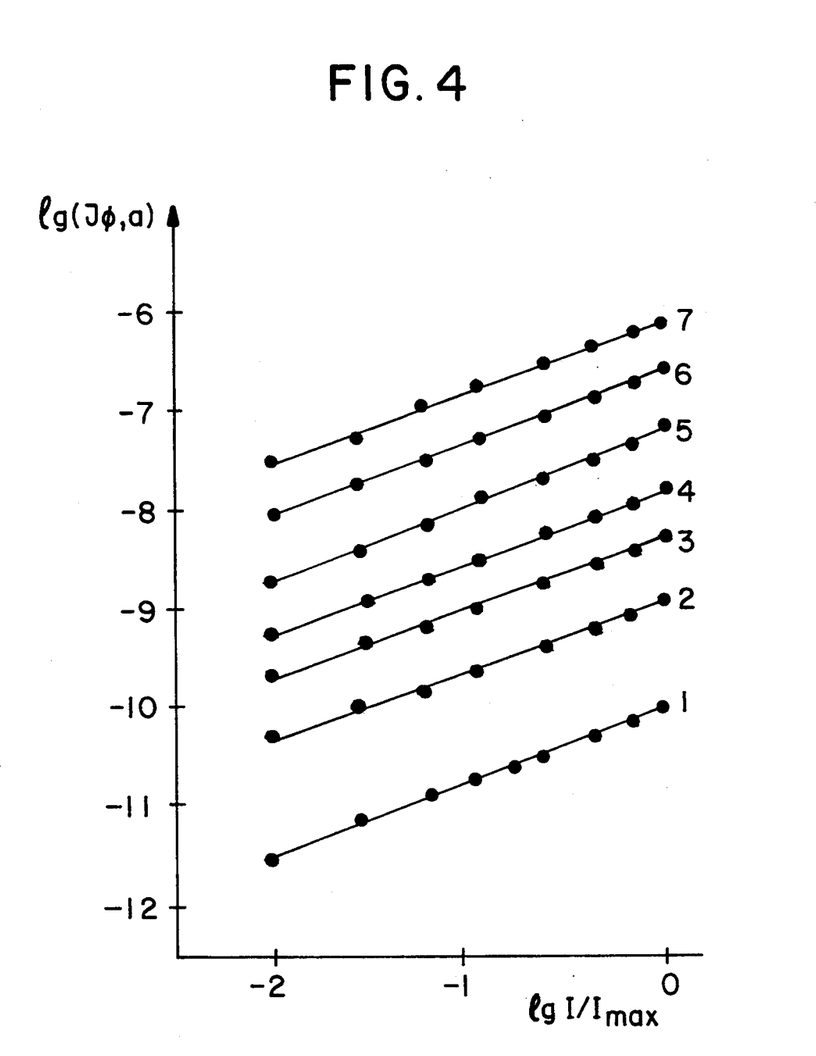
FIG. 4 is a graph showing the relationship between the stationary photo-current and the voltage in a photo-conducting layer in a photo-sensitive cell similar to that shown in FIG. 1.
Figure 5A:
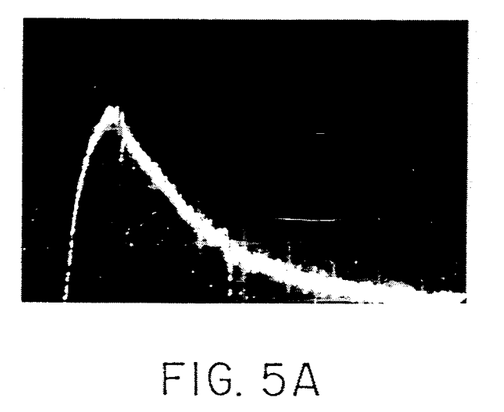
FIGS. 5a, 5b, 5c, 5d are oscillograms taken from the screen of a CV-13 memorizing oscillograph of voltage waveforms resulting from short (7 $\mu$sec.) light impulses applied to a photo-conducting layer in a photo-sensitive cell similar to that shown in FIG. 1.
Figure 5B:
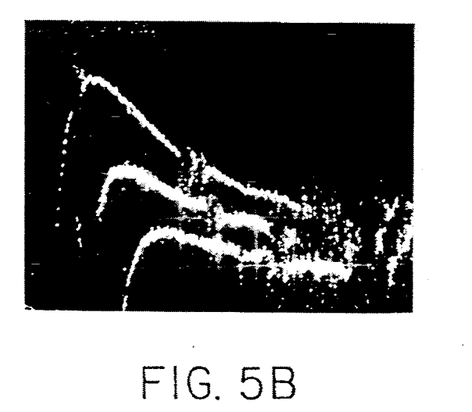
Figure 5C:
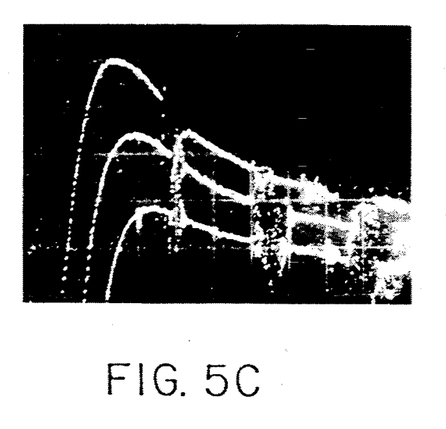
Figure 5D:
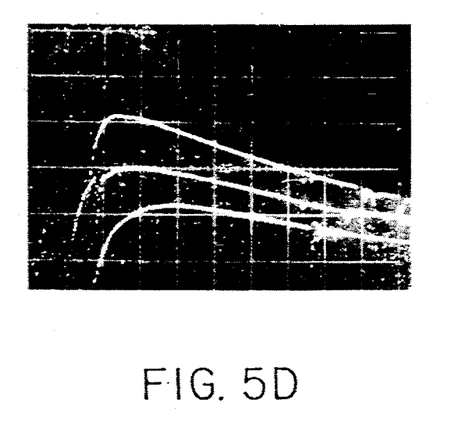

Referring to FIG. 4, a graph of the relationship between the stationary photo-current and voltage in a photo-conducting layer in the simple photosensitive cell is given for seven different applied voltages. The seven different applied voltages are: 1) 1 V; 2) 1 V; 3) 3 V; 4) 7 V; 5) 15 V; 6) 30 V; and 7) 45 V. As can be readily determined from the graph of FIG. 4, a result of the non-linear increase in the photo-current that is shown in the graph of FIG. 3 is a non-linear displacement in the quantum-ampere characteristics. This correlation is also characteristic of the pulse photo-current. Referring to FIGS. 5a, 5b, 5c, and 5d, there are shown four oscillograms taken from the screen of a CV-13 memorizing oscillograph of voltage waveforms resulting from short (7 μsec.) light impulses incident upon a photo-conducting layer in the simple photosensitive cell that has different voltages applied thereto. The applied voltage and the time division in the case of FIG. 5a are 0.5 V @50 μsec./div. The applied voltages and the time division in the case of FIG. 5b are 12 V, 14 V, 15 V, and 20 V @20 μsec./div. The applied voltages and the time division in the case of FIG. 5c are 20 V, 25 V, and 30 V @ 20 μsec./div. The applied voltages and the time division in the case of FIG. 5d are 40 V, 45 V, and 50 V @ 10 μsec./div. As can be readily, determined from the waveforms of FIGS. 5a, 5b, 5c, and 5d, there is a correlation between the non-linear displacement in the quantum-ampere characteristics of FIG. 4 and the pulse photo-current. A correlation also appears between the level of voltage and the maximum level of photo-current possible with the pulses.

Figure 6:
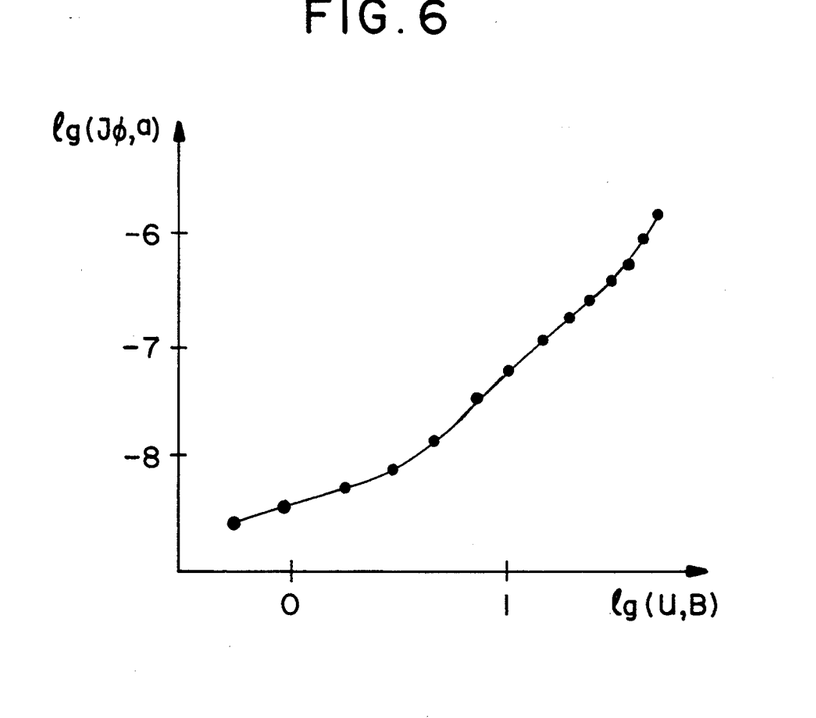
FIG. 6 is a graph showing the relationship between the amplitude of photo-response impulses and the voltage in a photo-conducting layer in a photo-sensitive cell similar to that shown in FIG. 1.

Referring to FIG. 6, a graph of the relationship between the amplitude of photo-response impulses and the voltage in a photo-conducting layer in the simple photosensitive cell is given. As can be readily determined from a comparison of the graph of FIG. 6 and the graph of FIG. 3, the VAC-type of impulse photo-current is analogous to the VAC stationary photo-current. Thus, the present invention sensor device allows an efficient registering not only of stationary or slowly shifting light drains, but also of moving images. Meanwhile, the inertia of the photo-receptor decreases as voltage is increased.

Figure 7:
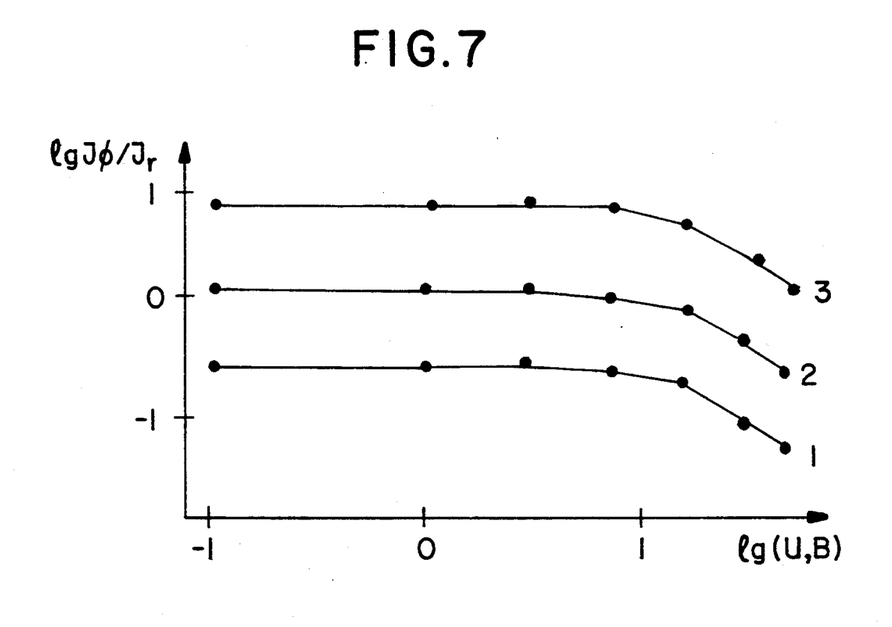
FIG. 7 is a graph showing the relationship between the adjusted video-signal $I_{ph}/I_d$ versus U in a photo-conducting layer in a photo-sensitive cell similar to that shown in FIG. 1.

Referring to FIG. 7, a graph of the relationship between the video-signal photo-current/dark current ($I_{ph}/I_d$) versus U in a photo-conducting layer in the simple photosensitive cell is given for three different light intensities. The three different light intensities are: 1) 1% $I_{max}$; 2) 10% $I_{max}$; and 3) $I = I_{max} = 7.10^{14}$ photon/cm² sec. From this graph the sensitivity and the dynamic range controls can be readily determined due to the double logarithmic scale. When the voltage level corresponds to VAC Ohm behavior, photosensitivity is determined not by the field, but changes to the VAC curve. It is possible to obtain an equal level of video signal for different degrees of lighting by regulating the voltage to the photo-conducting layer.

Indeed, the dark VAC may be expressed as, $$I_d = AU^m \tag{1}$$

wherein m is a constant $\geq 2$, and A is a constant.

The photo-current may be expressed as, $$I_\phi = VU^l I^n \text{ or } I_\phi = BU^l I^n \tag{2}$$

wherein B is a constant, 1 is a constant $\geq 2$ ($1 \geq m$), and n is a constant.

After several obvious transformations, we obtain the following equation for the video signal in the present invention sensor device, $$\log(I_{ph}/I_d) = \log(Bl/A_m) + (1-m)\log U + n\log I \tag{3}$$

wherein, for the photo-conducting layer, $m = -3.37$ and $1 = 2.1$.

The correlation slope which determines the control coefficient for photo-sensitivity is $-1.26$, which coincides closely to the $-1.21$ obtained from the experimental curve of FIG. 7. In this way, there is an internal modulation of the video-signal in the present invention sensor device, as well as a control feature for dynamic range and contrast.

The advantages inherent in the present invention sensor device are 1) the possibility of wider application to other functions; 2) its a higher resolution; and 3) its miniature size.

As compared with existing photo-electric devices, the present invention photo-electric device allows for a much greater density of cells. At the same time, the device is easily miniaturized, as the size of the simple cell is limited to a basic MDS transistor. At the present level of MDS micro chip technology, the size of the cell is in the range of 1 to 2 $\mu$m. The area surrounding the connecting layer of the simple cell should be of similar proportions, so that the size of the simple cell is no greater than 10 $\mu$m. In this way, a specific resolution of at least 100 mm$^{-1}$ is obtained with the proposed device, with a cell density of at least $10^6$ cm$^{-2}$ which is two times greater than in existing photo-electric devices.

In the field of opto-electronics, the present invention sensor device can serve both as a switch and as a set of logical cells, as several of the cells will switch on whenever there is a light scan or a projection of a particular image (depending on the light configuration on the surface), and the vertical and horizontal recharging bus-bars will be joined in the necessary sequence.

This device can also be applied in picture analysis, with discrimination as to the brightness level. An optical strobe signal is also possible. This may be produced by changing the voltage to the photo-conducting layer as well as the gate-source voltage bias.

When used in PMS (for example, in holographic PMS), this device allows for a high memory capacity. For example, a total memory capacity of $10^8$ bits is obtained if a laser beam is deflected along a holographic transparency with 10 vertical and horizontal positions (i.e. 100 holograms), or if the photo-receiving device contains as many as $10^6$ cells.

The present invention sensor device can also be effectively employed in television. According to Soviet TV standards (0.04 seconds and 625 lines per picture-frame), the commutation time per cell is approximately $10^{31\ 7}$ sec. Such conditions are easily achieved with the present invention sensor device, as the signal from the separate MDS transistor can be read in less than 25 nsec. Given these conditions, the number of cells for picture dissolution comes to $4 \times 10^5$ and the general resolution capability is approx. 1100 lines.

The distinct advantage of the present invention sensor device over existing photo-electric devices is that it can be applied to many different functions: for the collection, memorization, long-term storage and initial transformation (processing) of optic information.

With the present invention sensor device now fully described it can thus be seen that the primary objective set forth above is efficiently attained and, since certain changes may be made in the above described device without departing from the scope of the invention, it is intended that all matter contained in the above description or shown in the accompanying drawings shall be interpreted as illustrative and not in a limiting sense.

What is claimed is:

1. A high resolution sensor device for storing electromagnetic radiation and for transforming electromagnetic radiation into electrical signals, said device comprising:
   a substrate;
   a matrix of transistors formed in a surface of said substrate, each said transistor in said matrix having a source, a channel, and a drain;
   a dielectric layer formed over said matrix of transistors,
   a conducting layer formed over said dielectric layer, said conducting layer having openings formed therein, the location of said openings corresponding to the location of said matrix of transistors;
   a matrix of gates formed over said dielectric layer and within said openings in said conducting layer, said matrix of gates corresponding to said matrix of transistors;
   an active medium formed over said conducting layer, said matrix of gates, and said dielectric layer;
   a transparent injecting electrode formed over said active medium.

2. The device as defined in claim 1, wherein said active medium comprises a plurality of layers, at least one of which is made up of a ferro-magnetic material.

3. The device as defined in claim 1, wherein said active medium comprises a plurality of layers, at least one of which is made up of a ferro-electric material with $\epsilon >> 1$.

4. The device as defined in claim 1, wherein said active medium comprises a plurality of layers, at least one of which is made up of a piezo-electric material.

5. The device as defined in claim 1, wherein said active medium comprises a plurality of layers, at least one of which is made up of a luminescent material.

6. The device as defined in claim 1, wherein said active medium comprises a plurality of layers, at least one of which is made up of an organic polymeric material.

7. The device as defined in claim 1, wherein said active medium is fabricated of a ferro-magnetic material.

8. The device as defined in claim 1, wherein said active medium is fabricated of a ferro-electric material with $\epsilon >> 1$.

9. The device as defined in claim 1, wherein said active medium is fabricated of a piezo-electric material.

10. The device as defined in claim 1, wherein said active medium is fabricated of a luminescent material.

11. The device as defined in claim 1, wherein said active medium is fabricated of an organic polymeric material.

12. The device as defined in claim 1, further comprising vertical and horizontal scanning circuits having vertical and horizontal bus-bars that are connected to said sources and drains of said transistors in said transistor matrix.

13. The device as defined in claim 1, further comprising a voltage source connected to said conducting layer.

14. The device as defined in claim 1, further comprising a voltage source connected to said transparent injecting electrode.

* * * * *